United States Patent [19]

Lecinski et al.

[11] Patent Number: 6,011,221
[45] Date of Patent: Jan. 4, 2000

[54] CABLE MANAGEMENT APPARATUS AND METHOD

[75] Inventors: Daniel J. Lecinski, Arlington Heights; Susan I. English, Chicago; Kenneth S. Laughlin, Arlington Heights, all of Ill.

[73] Assignee: 3Com Corp., Rolling Meadows, Ill.

[21] Appl. No.: 09/034,171

[22] Filed: Mar. 2, 1998

[51] Int. Cl.[7] .................................................. H01B 3/00
[52] U.S. Cl. ........................ 174/72 A; 174/95; 174/97; 174/100; 174/136; 138/156; 138/162; 29/868
[58] Field of Search .................... 174/68.3, 71 R, 174/72 R, 95, 97, 100, 101, 68.1, 136, 92; 138/156, 157, 162, 166; 29/868, 869, 872

[56] References Cited

U.S. PATENT DOCUMENTS

| | | | |
|---|---|---|---|
| 1,590,569 | 6/1926 | Fisk ............................................ | 439/17 |
| 1,979,804 | 11/1934 | Lutz ...................................... | 285/152.1 |
| 1,992,574 | 2/1935 | Jenkins .................................. | 174/72 C |
| 2,137,536 | 11/1938 | McConnell ............................ | 174/72 C |
| 2,896,009 | 7/1959 | Caveney ................................ | 174/72 A |
| 3,120,574 | 2/1964 | Wesson, Jr. .............................. | 174/101 |
| 3,401,721 | 9/1968 | George ...................................... | 138/92 |
| 4,077,434 | 3/1978 | Sieckert et al. ........................... | 138/92 |
| 4,654,470 | 3/1987 | Feldman et al. . | |
| 4,896,784 | 1/1990 | Heath . | |
| 4,990,722 | 2/1991 | Navazo ...................................... | 174/97 |
| 5,134,250 | 7/1992 | Caveney et al. ......................... | 174/101 |
| 5,248,849 | 9/1993 | Schulte et al. . | |
| 5,285,349 | 2/1994 | Zander et al. . | |
| 5,306,870 | 4/1994 | Abat . | |
| 5,359,143 | 10/1994 | Simon . | |
| 5,390,968 | 2/1995 | Favalora .................................. | 285/179 |
| 5,534,664 | 7/1996 | Fearing, Jr. et al. . | |
| 5,541,364 | 7/1996 | Ratley . | |
| 5,556,059 | 9/1996 | Maeda et al. . | |

*Primary Examiner*—Kristine Kincaid
*Assistant Examiner*—Dhiru R Patel
*Attorney, Agent, or Firm*—Baniak Nicholas Pine & Gannon

[57] ABSTRACT

A cable management apparatus includes a cable trough having a body portion. A first side wall portion and a second wall portion each extend along a length of the body portion. The first side wall portion includes a plurality of notches formed therein and spaced along a length of the first side wall portion. A flange portion extends from each of the side wall portions. Each of the flange portions includes a plurality of openings formed therein. An elongated cover includes a plurality of fastening members spaced along a length of the cover. The fastening members are received in the flange openings to fasten the cover to the cable trough and to enclose cables routed within the cable trough while allowing cables to pass through the notches formed in the first side wall portion.

13 Claims, 2 Drawing Sheets

CABLE MANAGEMENT APPARATUS AND METHOD

FIELD OF THE INVENTION

This invention relates generally to a cable management apparatus for routing cables. In particular, the invention relates to an improved cable trough and cover for routing cables in a cabinet for housing electronic modules.

BACKGROUND OF THE INVENTION

Electronic modules, such as switching and routing modules, are typically housed in cabinets in a vertically stacked configuration. Numerous cables are routed into the cabinet. Once inside the cabinet, these cables must be routed to the various electronic modules housed within the cabinet. There are typically several cables connected to each of the electronic modules.

Raceways or cable troughs have been used to route cables to the various electronic modules housed within the cabinet. Typically, these cable troughs only have two openings, one at each end, and are vertically oriented within the cabinet. The disadvantage of this arrangement is that there is no way to gain access to the inside of the trough to arrange the cables in an orderly fashion. Moreover, these troughs do not allow cables to be inserted at various points along the length of the trough. As a result, the cables associated with a particular electronic module cannot be routed directly into the side of the trough. This may result in a cluttered cabinet which may make it difficult for a technician to access the various electronic modules within the cabinet.

Attempts have been made to provide a cable trough that allows access to cables along the length of the trough. For example, plastic troughs having spiral bound type ribs along their length may allow a user to open a front side of the cable trough to access the cables within the trough. However, these troughs have been found to be inadequate for several reasons. One reason is the difficulty in opening and closing the cable trough due to the spiral bound mating configuration of the ribs. Also, when multiple cables are routed within the trough, the spiral bound structure may prove to be inadequate to hold the cables within the trough. Moreover, when attempts are made to route several cables which are bundled together through the side of the trough, the small distance between the ribs may be inadequate to allow for the passage of the cables. Furthermore, plastic cable troughs do not aid in shielding electromagnetic emissions produced by the cables in the trough and other equipment inside the cabinet. Finally, plastic troughs cannot be electrically grounded to the cabinet to prevent electrical shock.

Accordingly, it would be desirable to have a cable management apparatus that overcomes the disadvantages described above, and to provide a simple and cost effective cable management apparatus.

SUMMARY OF THE INVENTION

One aspect of the invention provides a cable management apparatus for routing cables in a cabinet for housing electronic modules. A cable trough includes an elongated body portion having a length. A first side wall portion and a second side wall portion each extend along the length of the body portion. The first side wall portion includes a plurality of notches formed therein which are spaced along a length of the first side wall portion. A flange portion extends from each of the side wall portions and includes a plurality of openings formed therein. An elongated cover includes a length and a plurality of fastening members spaced along the length of the cover. The fastening members are received in the flange openings to fasten the cover to the cable trough and to enclose cables routed within the cable trough while allowing cables to pass through the notches formed in the first side wall portion. The plurality of fastening members may include a plurality of hook portions. A plurality of openings may be formed in the body portion of the cable trough for receiving fasteners to fasten the cable trough to the cabinet. A first elbow member may be secured to the body portion adjacent a first end of the body portion and a second elbow member may be secured to the body portion adjacent a second end of the body portion. The first elbow member may be the top elbow member and the second elbow member may be the bottom elbow member. The cable trough and the cover may be formed from a single piece of conductive material to provide electrical grounding and electromagnetic interference shielding.

Another aspect of the invention provides a cable management apparatus. A cabinet for housing electronic devices is provided. An electronic module is housed within the cabinet. A cable trough is vertically oriented within the cabinet and is fastened to an interior wall of the cabinet. The cable trough includes an elongated body portion having a length. A first side wall portion and a second side wall portion each extend along a length of the body portion. The first side wall portion includes a plurality of notches formed therein and spaced along a length of the first side wall portion. A flange portion extends from each of the side wall portions and includes a plurality of openings formed therein. An elongated cover includes a length and a plurality of fastening members spaced along the length of the cover. The fastening members are received in the flange openings to fasten the cover to the cable trough and to enclose cables routed within the cable trough while allowing cables to pass from the electronic module through the notches formed in the first side wall portion.

Another aspect of the invention provides a method of routing cables. A cabinet for housing electronic devices is provided. An electronic module is housed within the cabinet. A cable trough is vertically oriented within the cabinet and is fastened to an interior wall of the cabinet. The cable trough includes an elongated body portion having a length. A first side wall portion and a second side wall portion each extend along a length of the body portion. The side wall portion includes a plurality of notches formed therein and spaced along a length of the first side wall portion. A cable is routed from the electronic module through one of the notches.

Another aspect of the invention provides a method for routing cables. A cable trough including an elongated body portion having a length is provided. A first side wall portion and a second side wall portion each extend along the length of the body portion. The first side wall portion includes a plurality of notches formed therein and spaced along a length of the first side wall portion. A flange portion extends from each of the side wall portion and includes a plurality of openings formed therein. An elongated cover includes a length and a plurality of fastening members spaced along the length of the cover. A cable is routed within the cable trough. Fastening members are inserted into the plurality of openings formed in the flange portion to fasten the cover to the cable trough. Electromagnetic emissions may be prevented from exiting between the cable trough and the cover. The cable trough and the cover may be electrically grounded.

Another aspect of the invention provides a method for routing cables. A cabinet for housing electronic devices is provided. An electronic module is housed within the cabinet. A cable trough is vertically mounted within the cabinet and includes an elongated body portion having a length. A first side wall portion and a second side wall portion each extend along the length of the body portion. The first side wall portion includes a plurality of notches formed therein and spaced along a length of the first side wall portion. A flange portion extends from each of the side wall portions and includes a plurality of openings formed therein. An elongated cover includes a length and a plurality of fastening members spaced along the length of the cover. A cable is routed from the electronic module through one of the notches. The fastening members are inserted into the plurality of openings formed in the flange portion to fasten the cover to the cable trough.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which are defined by the appended claims and equivalents thereof.

DETAILED DESCRIPTION OF THE DRAWINGS

DETAILED DESCRIPTION OF THE PRESENTLY PREFERRED EMBODIMENTS

Figure 1:
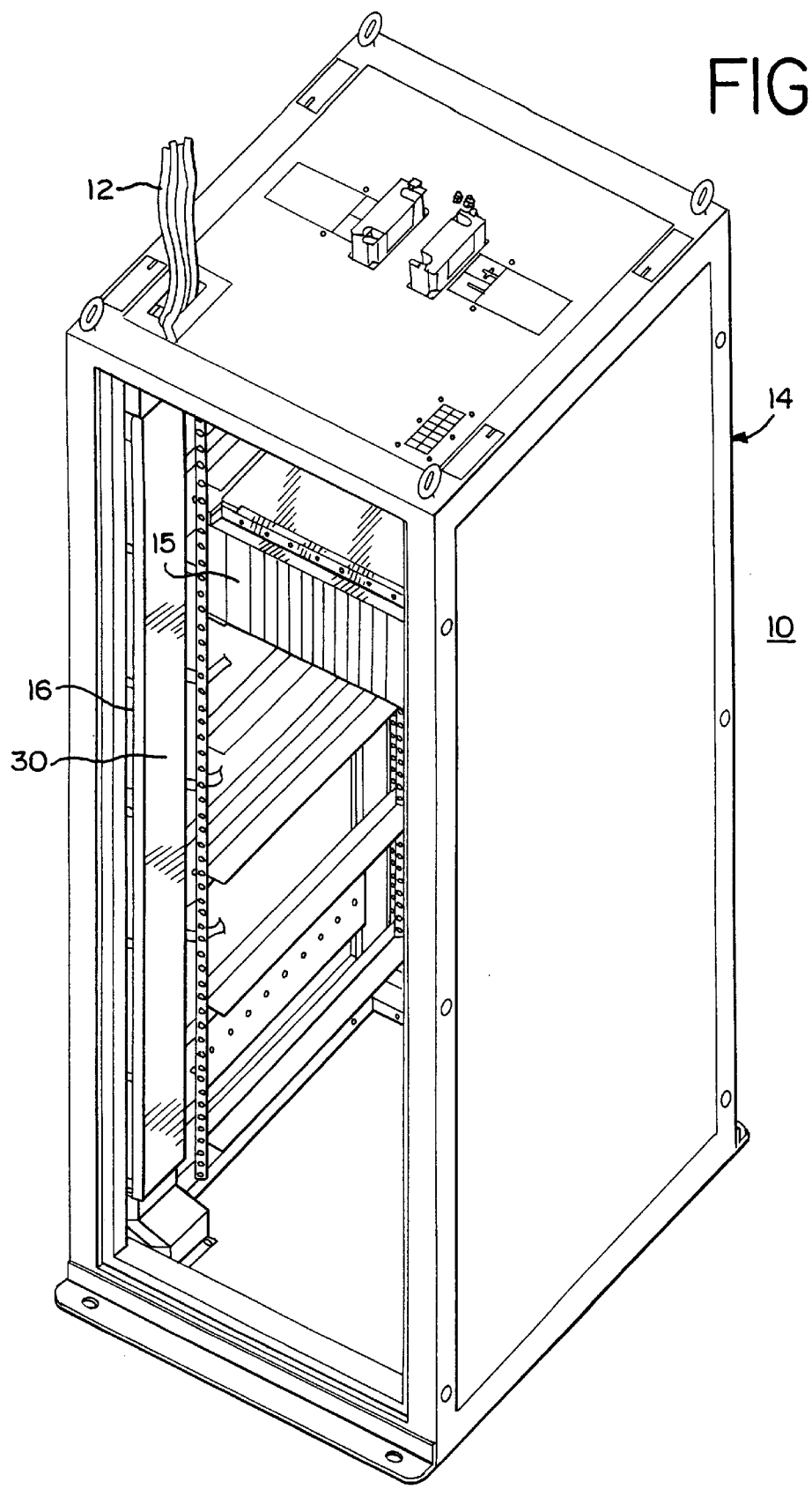
FIG. 1 is a perspective view of a preferred embodiment of a cable management apparatus which is made in accordance with the invention.
Figure 2:
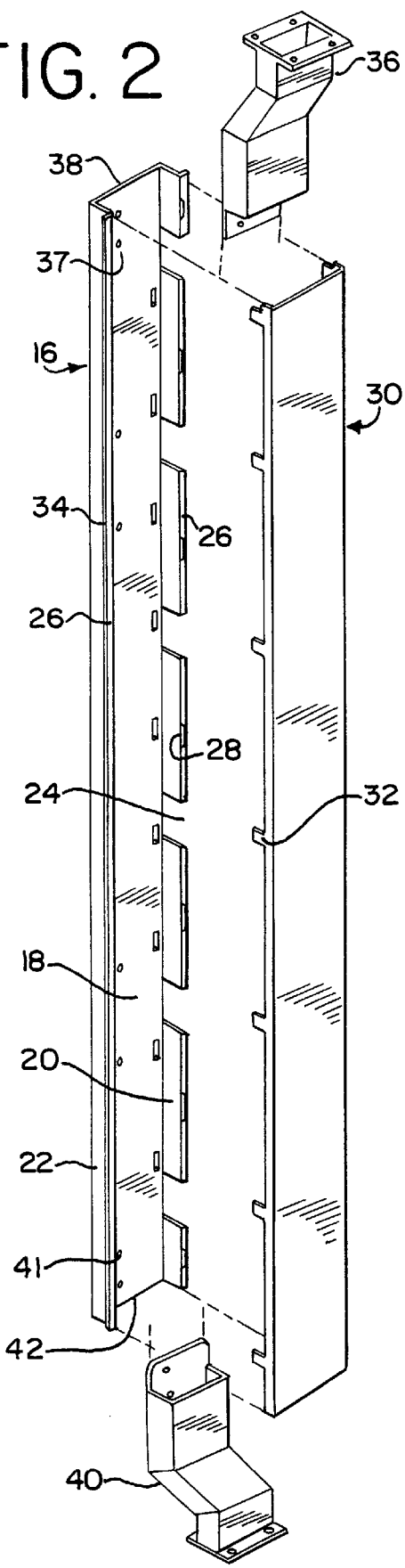
FIG. 2 is an exploded perspective view of the cable trough, cover, and elbow members of the embodiment of FIG. 1.
Figure 3:
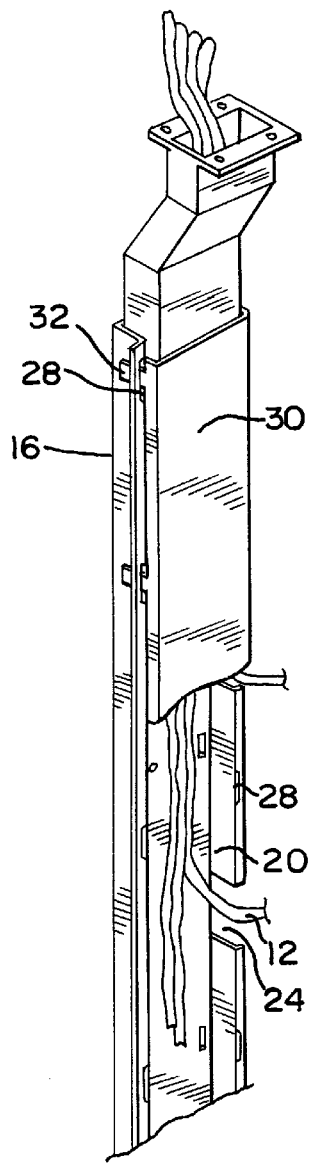
FIG. 3 is a cutaway view of the cover fastened to the cable trough.

As shown in FIGS. 1–3, a preferred embodiment of a cable management apparatus 10 for routing cables 12 in a cabinet 14 for housing electronic modules 15 includes a cable trough 16. Referring to FIG. 2, the cable trough 16 includes an elongated body portion 18 having a length. A first side wall portion 20 and a second side wall portion 22 each extend along the length of the body portion 18. The first side wall portion 20 includes a plurality of notches 24 formed therein and spaced along a length of the first side wall portion 20. A flange portion 26 extends from each of the side wall portions 20, 22. Each of the flange portions 26 includes a plurality of openings 28 formed therein.

A plurality of openings 34 may be formed in the body portion 18 of the cable trough 16 for receiving fasteners to fasten the cable trough 16 to the cabinet 14. In the embodiment shown, the cable trough 16 is vertically mounted within the cabinet 14. Any conventional fastening means may be used to fasten the cable trough 16 to the cabinet 14 such as, for example, screws, bolts, or rivets. Alternatively, the cable trough 16 may be welded to the cabinet 14.

The cabinet 14 may be any of the commercially available cabinets suitable for housing electronic modules 15. The electronic module 15 may include any type of electronic device including, for example, an office router, a port expansion device, a managed modem pool device, an access concentrator, a redundant power device, a LAN switch, an edgeserver, and other types of electronic devices.

Referring to FIG. 2, an elongated cover 30 includes a plurality of fastening members 32 spaced along a length of the cover 30. As shown in FIG. 3, the fastening members 32 are received in the flange openings 28 to fasten the cover 30 to the cable trough 16 and to enclose cables 12 routed within the cable trough 16 while allowing cables 12 to pass through the notches 24 formed in the first side wall portion 20. In the embodiment shown, the fastening members 32 include a plurality of hook portions which are slidably received into the flange openings 28. Alternatively, the fastening members 32 may include other shapes and configurations. One advantage of this invention is that the notches 24 formed in the body portion 18 of the cable trough 16 allow a cable 12 to be routed directly from an electronic module 15 into the cable trough 16. This provides a convenient and cost effective solution to the cable management problems associated with the large number of cables 12 which must be routed with the cabinet 14. Moreover, the entire length of the cable trough 16 can be accessed by simply removing the slide-on cover 30. This allows a technician to arrange and manage cables 12 within the cable trough 16. No tools are required to remove and install the cover 30.

Referring to FIG. 2, a first elbow member 36 may preferably be secured to the body portion 18 adjacent a first end 38 of the body portion 18. In the embodiment shown, the first elbow member 36 is the top elbow member. Openings 37 may be formed adjacent the first end 38 of the body portion 18 to receive fasteners to fasten the first elbow member 36 to the body portion 18. A second elbow member 40 may preferably be secured to the body portion 18 adjacent a second end 42 of the body portion 18. In the embodiment shown, the second elbow member 40 is the bottom elbow member. Openings 41 may be formed adjacent the second end 42 of the body portion 18 to receive fasteners to fasten the second elbow member 40 to the body portion 18. Any conventional fastening means may be used to fasten the first and second elbow members to the body portion 18 such as, for example, screws, bolts, or rivets.

The cable trough 16 and the cover 30 each may preferably be formed from a single piece of rigid conductive material, such as, for example, steel. Other types of conductive material which can provide electrical grounding and electromagnetic interference shielding are also contemplated.

The apparatus shown in FIGS. 1–3 may be used for routing cables 12 in a cabinet 14 for housing electronic modules 15. One or more cables 12 may be vertically routed within the cable trough 14 along the length of the body portion 18. In addition, a cable 12 which is connected to the electronic module 15 may be routed from the electronic module 15 through one of the notches 24. Fastening members 32 of the cover 30 may be inserted into the plurality of openings 28 formed in the flange portion 26 to fasten the cover 30 to the cable trough 16. The cable trough 16 and the cover 30 aid in shielding electromagnetic emissions produced by the cables 12 within the cable trough 18 and other equipment inside the cabinet 14. Moreover, the cable trough 16 and the cover 30, when fastened to the cabinet 14, may be electrically grounded to the cabinet 14 to prevent electrical shock.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A cable management apparatus for routing cables in a cabinet for housing electronic modules comprising:

a cable trough including an elongated body portion having a length, a first side wall portion and a second side wall portion each extending along the length of the body portion, the first side wall portion including a plurality of notches formed therein and spaced along a length of the first side wall portion, a flange portion extending from each of the side wall portions, each of the flange portions including a plurality of openings formed therein, an elongated cover including a length, the cover including a plurality of fastening members spaced along the length of the cover, the plurality of fastening members received in the flange openings to fasten the cover to the cable trough and to enclose cables routed within the cable trough while allowing the cables to pass through the notches formed in the first side wall portion.

2. The apparatus of claim 1 wherein the plurality of fastening members includes a plurality of hook portions.

3. The apparatus of claim 1 further comprising a plurality of openings formed in the body portion of the cable trough for receiving fasteners to fasten the cable trough to a cabinet for housing electronic modules.

4. The apparatus of claim 1 further comprising a first elbow member secured to the body portion adjacent a first end of the body portion and a second elbow member secured to the body portion adjacent a second end of the body portion.

5. The apparatus of claim 4 wherein the first elbow member is the top elbow member and the second elbow member is the bottom elbow member.

6. The apparatus of claim 1 wherein the cable trough is formed from a single piece of conductive material to provide electrical grounding and electromagnetic interference shielding.

7. The apparatus of claim 1 wherein the cover is formed from a single piece of conductive material to provide electrical grounding and electromagnetic interference shielding.

8. A cable management apparatus comprising:

a cabinet for housing electronic devices, an electronic module housed within the cabinet;

a cable trough vertically oriented within the cabinet and fastened to an interior wall of the cabinet, the cable trough including an elongated body portion having a length, a first side wall portion and a second side wall portion each extending along a length of the body portion, the first side wall portion including a plurality of notches formed therein and spaced along a length of the first side wall portion, a flange portion extending from each of the side wall portions, each of the flange portions including a plurality of openings formed therein, an elongated cover including a length, the cover including a plurality of fastening members spaced along the length of the cover, the plurality of fastening members received in the flange openings to fasten the cover to the cable trough and to enclose cables routed within the cable trough while allowing cables to pass from the electronic module through the plurality of notches formed in the first side wall portion.

9. A method of routing cables comprising:

providing a cabinet for housing electronic devices, an electronic module housed within the cabinet, a cable trough vertically oriented within the cabinet and fastened to an interior wall of the cabinet, the cable trough including an elongated body portion having a length, a first side wall portion and a second side wall portion each extending along a length of the body portion, the first side wall portion including a plurality of notches formed therein and spaced along a length of the first side wall portion; and routing a cable from the electronic module through one of the plurality of notches.

10. A method for routing cables comprising:

providing a cable trough including an elongated body portion having a length, a first side wall portion and a second side wall portion each extending along the length of the body portion, the first side wall portion including a plurality of notches formed therein and spaced along a length of the first side wall portion, a flange portion extending from each of the side wall portion, each of the flange portions including a plurality of openings formed therein, an elongated cover including a length, the cover including a plurality of fastening members spaced along the length of the cover;

routing a cable within the cable trough; and inserting the Plurality of fastening members into the plurality of openings formed in the flange portion to fasten the cover to the cable trough.

11. The method of claim 10 further comprising:

preventing electromagnetic emissions from exiting between the cable trough and the cover.

12. The method of claim 10 further comprising:

electrically grounding the cable trough and the cover.

13. A method for routing cables comprising:

providing a cabinet for housing electronic devices, an electronic module housed within the cabinet, a cable trough vertically mounted within the cabinet including an elongated body portion having a length, a first side wall portion and a second side wall portion each extending along the length of the body portion, the first side wall portion including a plurality of notches formed therein and spaced along a length of the first side wall portion, a flange portion extending from each of the side wall portions, each of the flange portions including a plurality of openings formed therein, an elongated cover including a length, the cover including a plurality of fastening members spaced along the length of the cover;

routing a cable from the electronic module through one of the plurality of notches; and inserting the plurality of fastening members into the plurality of openings formed in the flange portion to fasten the cover to the cable trough.

* * * * *